US008847465B2

(12) United States Patent
Teng (10) Patent No.: US 8,847,465 B2
(45) Date of Patent: Sep. 30, 2014

(54) PIEZOELECTRIC RESONATOR WITH BUILT-IN CAPACITOR LOAD AND MANUFACTURING METHOD THEREOF

(75) Inventor: Bill Teng, Taipei (TW)

(73) Assignee: Taitien Electronics Co., Ltd, Taipei (TW)

( * ) Notice: Subject to any disclaimer, the term of this patent is extended or adjusted under 35 U.S.C. 154(b) by 274 days.

(21) Appl. No.: 13/443,969

(22) Filed: Apr. 11, 2012

(65) Prior Publication Data
US 2013/0270966 A1 Oct. 17, 2013

(51) Int. Cl.
*H01L 41/047* (2006.01)
(52) U.S. Cl.
USPC .......................... 310/321; 310/320; 310/311
(58) Field of Classification Search
USPC ............ 310/365–367, 348, 344, 311, 313 C, 310/320, 321; 333/193–199
See application file for complete search history.

(56) References Cited

U.S. PATENT DOCUMENTS

| 5,502,344 A * | 3/1996 | Yoshimoto et al. ........... 310/344 |
| 7,439,658 B2 * | 10/2008 | Aratake ........................ 310/344 |
| 7,745,980 B2 * | 6/2010 | Furue et al. .................... 310/365 |
| 7,893,600 B2 * | 2/2011 | Furue et al. .................... 310/344 |
| 2007/0063623 A1 * | 3/2007 | Nakao et al. ................... 310/366 |

* cited by examiner

*Primary Examiner* — Thomas Dougherty
*Assistant Examiner* — Karen B Addison
(74) *Attorney, Agent, or Firm* — SmithAmundsen LLC; Kelly J. Smith; Dennis S. Schell (57) ABSTRACT

A piezoelectric resonator includes a resonator substrate having a resonating body with a thickness that is associated with a resonant frequency, a conductor disposed on the resonating body and having a body electrode, a base having a groove aligned with the body electrode and defined by a groove-defining wall, a base electrode disposed on the groove-defining wall and cooperating with the body electrode and the base to form a capacitor load, and a cap disposed on the resonator substrate in a manner that the resonator substrate is sandwiched between the cap and the base.

8 Claims, 7 Drawing Sheets

PIEZOELECTRIC RESONATOR WITH BUILT-IN CAPACITOR LOAD AND MANUFACTURING METHOD THEREOF

BACKGROUND OF THE INVENTION

1. Field of the Invention

The invention relates to a piezoelectric resonator and a manufacturing method thereof, and more particularly to a piezoelectric resonator with a built-in capacitor load.

2. Description of the Related Art

A quartz crystal is a piezoelectric component, which outputs a resonant frequency with high precision when a voltage is applied thereto.

Figure 1:
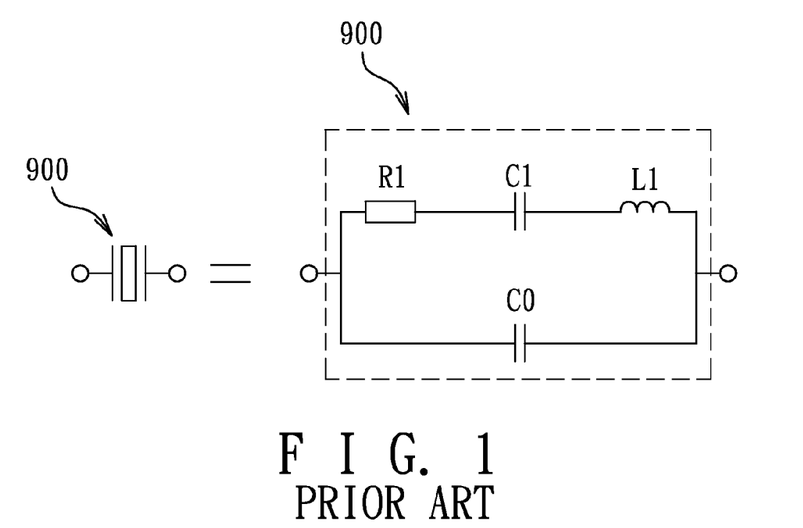
FIG. 1 illustrates an equivalent circuit of a quartz crystal.

FIG. 1 shows an equivalent circuit of a quartz crystal 900, which includes an equivalent resistor R1, an equivalent capacitor C1, and an equivalent inductor L1 connected in series, and a capacitor C0 connected in parallel. The resonant frequency of the quartz crystal 900 is determined by a resistance of the equivalent resistor R1, capacitance of the capacitors C1, C0, and an inductance of the equivalent inductor L1.

Figure 2:
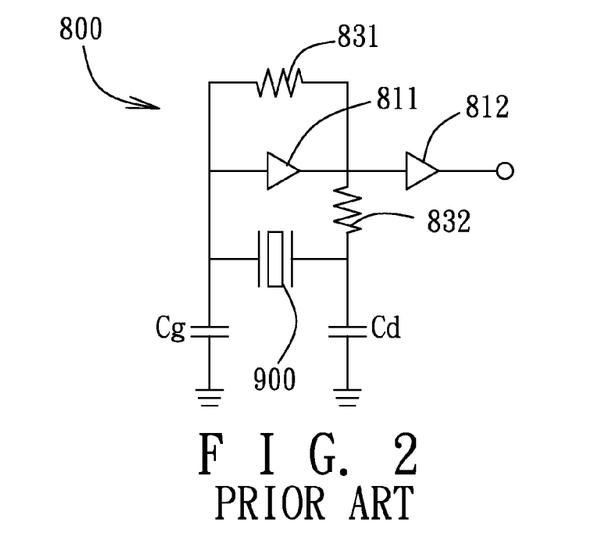
FIG. 2 is a circuit diagram showing a conventional resonator circuit of a piezoelectric transformer.

FIG. 2 shows a conventional resonator circuit 800 of a piezoelectric transformer applied in an inverter. The conventional resonator circuit 800 includes a quartz crystal 900, two resistors 831 and 832, two amplifiers 811 and 812, and two capacitor loads Cg and Cd. Two terminals of the quartz crystal 900 are respectively coupled to the capacitor loads Cg and Cd, and respectively coupled to the resistors 831 and 832. One terminal of the quartz crystal 900 is further coupled to the amplifier 811. A resonant signal of the resonator circuit 800 is outputted through the amplifier 812.

Figure 3:
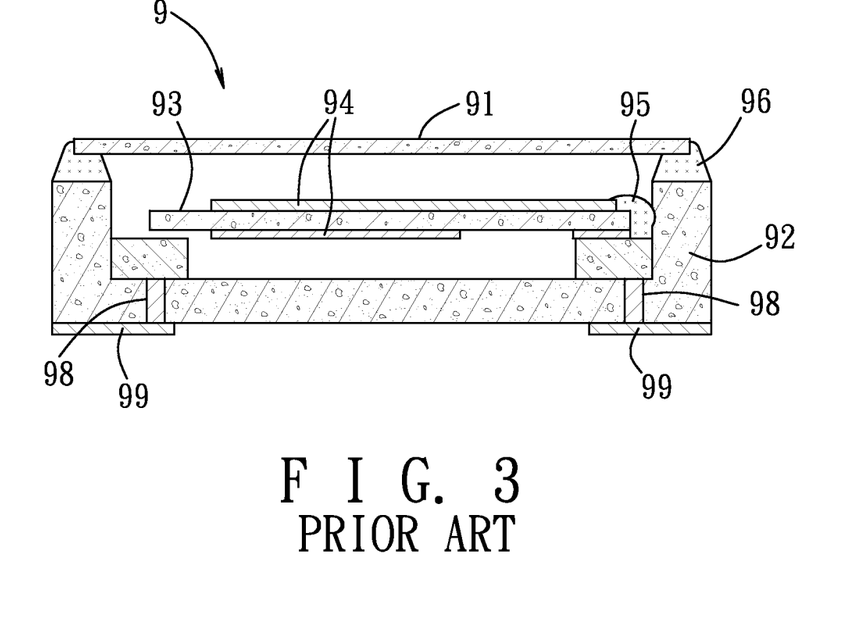
FIG. 3 is a schematic diagram showing a conventional piezoelectric resonator.

Referring to FIG. 3, a conventional piezoelectric resonator 9 comprises a ceramic cap 91, a ceramic base 92, a quartz chip 93 disposed between the cap 91 and the base 92, two electrodes 94 respectively disposed on two sides of the quartz chip 93, a conductive silver paste 95, a low temperature glass 96, two vias 98, and two conductors 99.

The ceramic cap 91 is bonded to the ceramic base 92 using the low temperature glass 96, and the electrodes 94 are connected to the conductors 99 on the base 92 through the conductive silver paste 95, a circuit (not shown), and the vias 98.

However, the equivalent circuit of the piezoelectric resonator shown in FIG. 3 is that shown in FIG. 1, and the resonant frequency is determined by a thickness of the quartz chip 93 without the capacitor loads Cg and Cd shown in FIG. 2. In addition, the conventional piezoelectric resonator 9 comprises many different materials, and results in the following drawbacks:

1. Using the conductive silver paste 95 to connect the electrodes 94 to the circuit and the conductors 99 can cause release of a solvent gas, and leads to an aging (frequency shift) issue.

2. Physical properties (such as expansion coefficient) differ among different materials, and may result in instability of the resonant frequency of the piezoelectric resonator 9.

3. Seam welding or low temperature glass bonding produces stress on the ceramic base 92 and the quartz chip 93, and may result in product deterioration.

SUMMARY OF THE INVENTION

Therefore, an object of the present invention is to provide a piezoelectric resonator with a built-in capacitor load and a manufacturing method thereof that can avoid instability attributed to use of different materials.

According to the present invention, a piezoelectric resonator comprises:

a resonator substrate having a frame with an inner side, a resonating body that is disposed in the frame, that has an outer periphery spaced apart from the inner side of the frame, and that has a base-side surface, and a connecting part that interconnects the frame and the resonating body, wherein the resonating body has a thickness that is associated with a resonant frequency;

a first conductor having a first body electrode that is disposed on the base-side surface;

a base on which the resonator substrate is disposed, the base having a first base surface in contact with the first conductor, and a second base surface opposite to the first base surface, the second base surface having a first groove aligned with the first body electrode and defined by a first groove-defining wall;

a first base electrode disposed on the first groove-defining wall and cooperating with the first body electrode and the base to form a first capacitor load, wherein the first capacitor load has a capacitance determined according to a thickness of the base between the first body electrode and the first base electrode and an area of overlap between the first body electrode and a projection of the first base electrode on the first body electrode; and a cap disposed on the resonator substrate in a manner that the resonator substrate is sandwiched between the cap and the base.

According to another aspect of the invention, a method of manufacturing a piezoelectric resonator comprises the following steps of:

a) forming a first base material into a plurality of interconnected resonator substrates each having a frame with an inner side, a resonating body that is disposed in the frame, that has an outer periphery spaced apart from the inner side of the frame, and that has a base-side surface, and a connecting part that interconnects the frame and the resonating body, wherein the resonating body has a thickness that is associated with a resonant frequency and wherein each of the resonator substrates is formed with a first conductor having a first body electrode that is disposed on the base-side surface;

b) forming a second base material into a plurality of interconnected bases on which the resonator substrates are to be respectively disposed, each of the bases having a first base surface to contact the first conductor formed on the respective resonator substrate, and a second base surface opposite to the first base surface, the second base surface having a first groove to be aligned with the first body electrode and defined by a first groove-defining wall, each of the bases being formed with a first base electrode that is disposed on the first groove-defining wall;

c) sandwiching the resonator substrates between a third base material and the bases on the second base material, and bonding together the first, second and third base materials to form an assembly; and d) cutting the assembly to form a plurality of the piezoelectric resonators, each including one of the resonator substrates, one of the bases, and a cap formed from the third base material and disposed on the resonator substrate;

wherein, for each of the piezoelectric resonators, the first base electrode is disposed to cooperate with the first body electrode formed on the resonator substrate and the base to form a first capacitor load, the first capacitor load having a capacitance determined according to a thickness of the base between the first body electrode and the first base electrode and an area of overlap between the first body electrode and a projection of the first base electrode on the first body electrode.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENT

Figure 4:
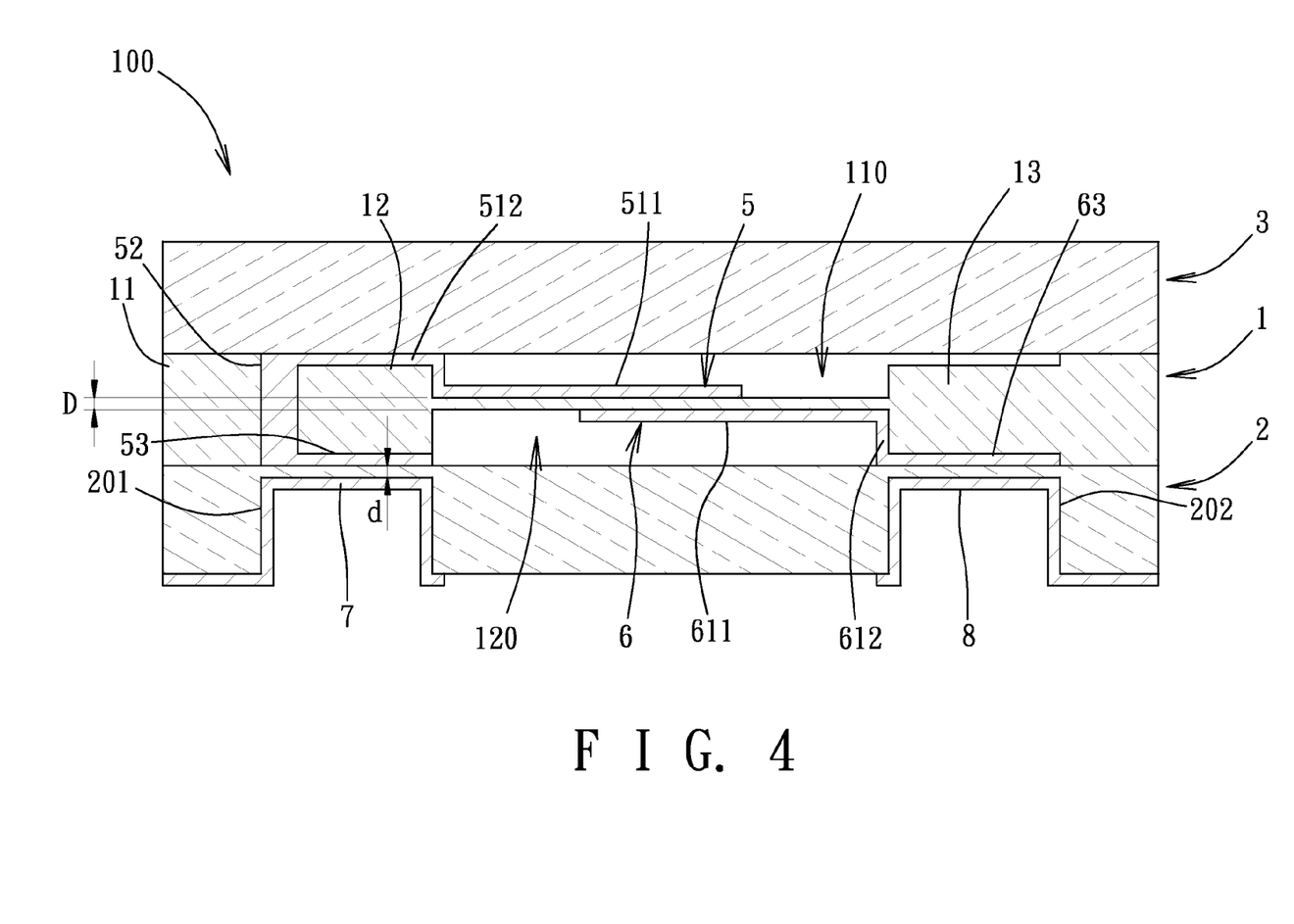
FIG. 4 is a sectional view showing a preferred embodiment of the piezoelectric resonator with built-in capacitor load according to the present invention.

Referring to FIG. 4, a preferred embodiment of the piezoelectric resonator 100 according to this invention is shown to comprise a resonator substrate 1, a base 2, a cap 3, a first conductor 5, a first base electrode 7, a second conductor 6, and a second base electrode 8. In this embodiment, the resonator substrate 1, the base 2, and the cap 3 are all made of quartz, while the first conductor 5, the first base electrode 7, the second conductor 6, and the second base electrode 8 are all made of metal.

Figure 8:
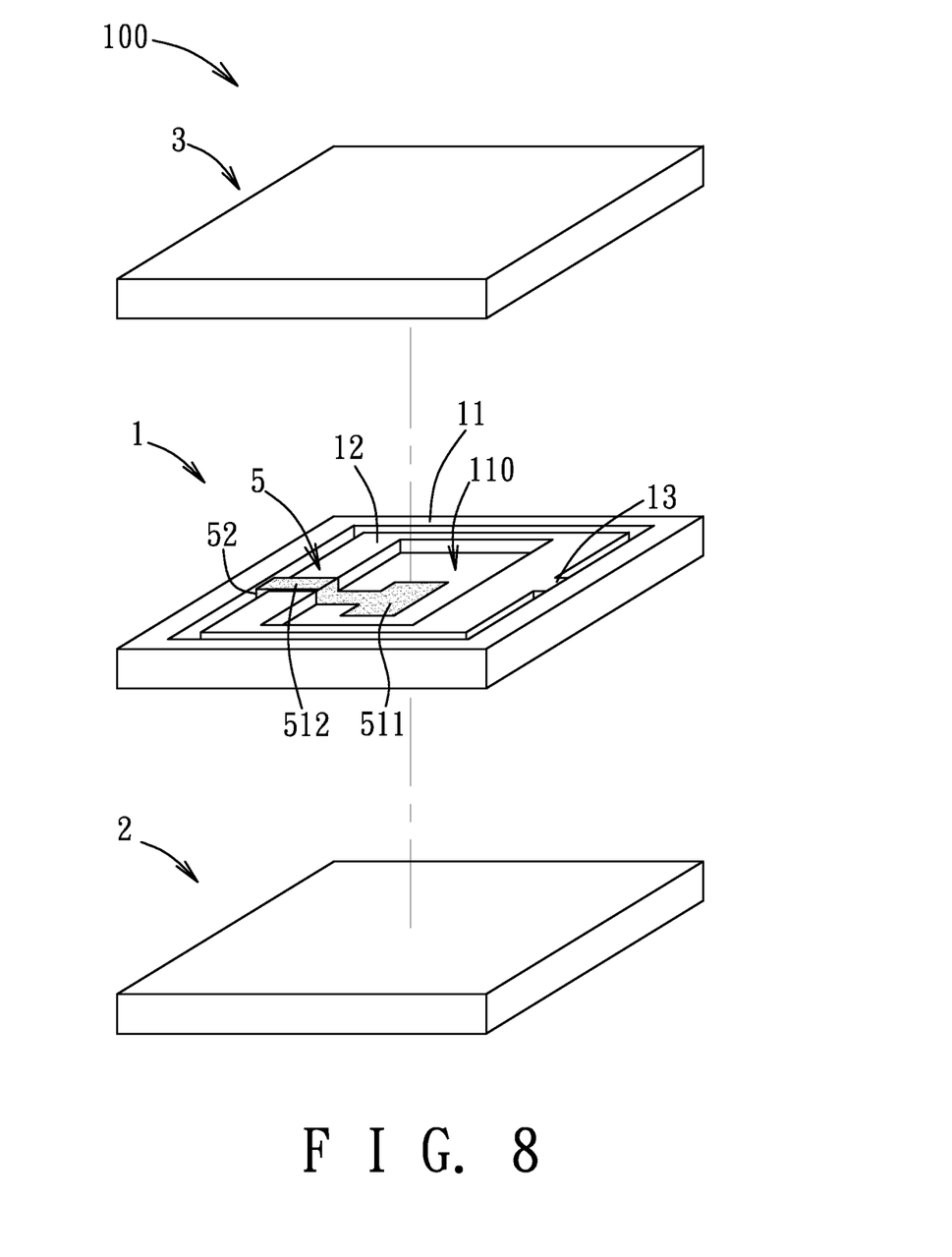
FIG. 8 is an exploded top perspective view of the preferred embodiment of the piezoelectric resonator.

The resonator substrate 1 is sandwiched between the cap 3 and the base 2, and has a frame 11 (the outer appearance thereof is shown in FIG. 8) with an inner side, a resonating body 12 that is disposed in the frame 11, that has an outer periphery spaced apart from the inner side of the frame 11, and that has a base-side surface, and a connecting part 13 that interconnects the frame 11 and the resonating body 12. The resonating body 12 has a thickness D that is associated with a resonant frequency.

The first conductor 5 has a first body electrode 53 that is disposed on the base-side surface.

The second conductor 6 has a second body electrode 63 that is disposed on the base-side surface and that is spaced apart from the first body electrode 53.

The base 2, on which the resonator substrate 1, is disposed has a first base surface in contact with the first conductor 5 and the second conductor 6, and a second base surface opposite to the first base surface. The second base surface has at least one groove formed therein. In this embodiment, the number of the grooves is two, and includes a first groove 201 aligned with the first body electrode 53 and defined by a first groove-defining wall, and a second groove 202 aligned with the second body electrode 63 and defined by a second groove-defining wall.

The first base electrode 7 is disposed on the first groove-defining wall and cooperates with the first body electrode 53 and the base 2 to form a first capacitor load. The first capacitor load has a capacitance determined according to a thickness d of the base 2 between the first body electrode 53 and the first base electrode 7 and an area of overlap between the first body electrode 53 and a projection of the first base electrode 7 on the first body electrode 53.

The second base electrode 8 is disposed on the second groove-defining wall and cooperates with the second body electrode 63 and the base 2 to form a second capacitor load. The second capacitor load has a capacitance determined according to the thickness d of the base 2 between the second body electrode 63 and the second base electrode 8 and an area of overlap between the second body electrode 63 and a projection of the second base electrode 8 on the second body electrode 63.

Quartz is a dielectric material, while capacitance is proportional to an area of overlap between two electrodes, and is inversely proportional to a thickness of a dielectric material between the two electrodes. The formula for capacitance is thus:

$$C = \frac{\varepsilon \times A}{d};$$

in which, C is capacitance, $\in$ is a relative dielectric constant of the dielectric material (quartz), A is an area of overlap between two electrodes, and d is a thickness of the base 2 between the two electrodes.

For example, a relative dielectric constant $\in$ of quartz is $40\times10^{-12}$ Farad/m, a predetermined area A of overlap between the first body electrode 53 and the projection of the first base electrode 7 on the first body electrode 53 is 0.196 mm$^2$, and a predetermined thickness d of the base 2 between the first body electrode 53 and the first base electrode 7 is 0.008 mm. Through the aforesaid formula, capacitance is determined to be 1 pF.

Figure 5:
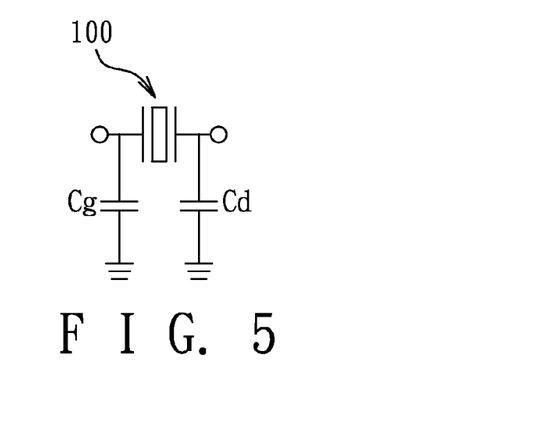
FIG. 5 is an equivalent resonator circuit of the piezoelectric resonator shown in FIG. 4.

FIG. 5 shows an equivalent resonator circuit of the piezoelectric resonator 100 shown in FIG. 4. The resonator circuit includes the quartz crystal 900 (which has the thickness D that is associated with the resonant frequency), the capacitor load Cg (determined according to the thickness d of the base 2 between the first body electrode 53 and the first base electrode 7 and the area of overlap between the first body electrode 53 and the projection of the first base electrode 7 on the first body electrode 53), and the capacitor load Cd (determined according to the thickness d of the base 2 between the second body electrode 63 and the second base electrode 8 and the area of overlap between the second body electrode 63 and the projection of the second base electrode 8 on the second body electrode 63).

Figure 6:
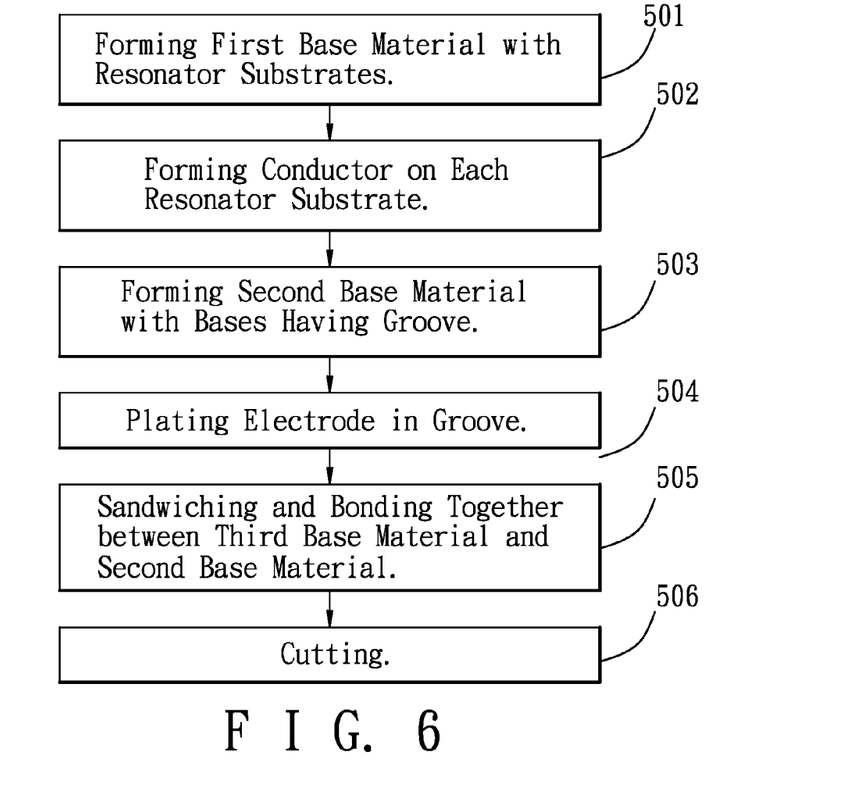
FIG. 6 is a flow chart illustrating a preferred embodiment of a manufacturing method of the piezoelectric resonator according to the present invention.
Figure 7:
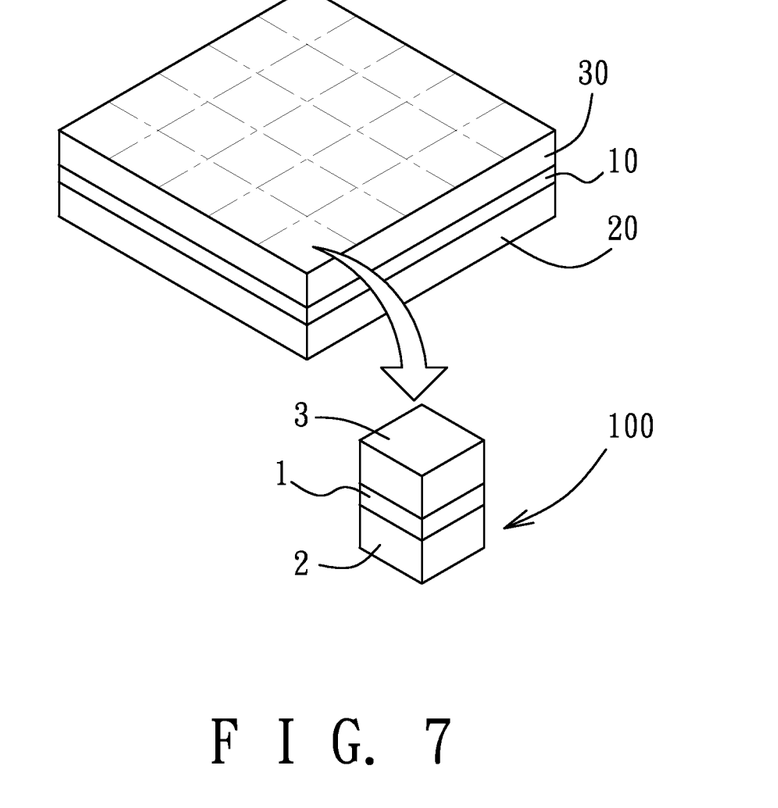
FIG. 7 is a schematic diagram illustrating an assembly comprising a plurality of piezoelectric resonators.

Referring to FIG. 6 and FIG. 7, a method of manufacturing the piezoelectric resonator 100 with the built-in capacitor loads Cg, Cd comprises the following steps.

Step 501: form a first base material 10 into a plurality of interconnected resonator substrates 1 each having a frame 11 with an inner side, a resonating body 12 that is disposed in the frame 11, that has an outer periphery spaced apart from the inner side of the frame 11, and that has a base-side surface, and a connecting part 13 that interconnects the frame 11 and the resonating body 12, wherein the resonating body 12 has a thickness D that is associated with a resonant frequency.

Step 502: form at least one conductor having a body electrode that is disposed on the base-side surface of each of the resonator substrates 1, such as the first conductor 5 having a first body electrode 53, and the second conductor 6 having a second body electrode 63, as shown in FIG. 4. The second body electrode 63 is spaced apart from the first body electrode 53.

Step 503: form a second base material 20 into a plurality of interconnected bases 2 on which the resonator substrates 1 are to be respectively disposed. Each of the bases 2 has a first base surface to contact the first conductor 5 and the second conductor 6 formed on the respective resonator substrate 1, and a second base surface opposite to the first base surface. The second base surface has at least one groove defined by a groove-forming wall. In this embodiment, the second base surface has a first groove 201 to be aligned with the first body electrode 53 and defined by a first groove-defining wall, and a second groove 202 to be aligned with the second body electrode 63 and defined by a second groove-defining wall. The first, second and third base materials are made of quartz in this embodiment, and are bonded together using any suitable bonding technique known to those skilled in the art.

Step 504: plate an electrode on each groove-forming wall, such as a first base electrode 7 on the first groove-defining wall, and a second base electrode 8 on the first groove-defining wall.

Step 505: sandwich the resonator substrates 1 between a third base material 30 and the bases 2 on the second base material 20, and bond together the first, second and third base materials 10, 20, 30 to form an assembly.

Step 506: cut the assembly to form a plurality of the piezoelectric resonators 100, each including one of the resonator substrates 1, one of the bases 2, and a cap 3 formed from the third base material 30 and disposed on the resonator substrate 1, as shown in FIG. 7.

For each of the piezoelectric resonators 100, the first base electrode 7 is disposed to cooperate with the first body electrode 53 formed on the resonator substrate 1 and the base 2 to form a first capacitor load. The first capacitor load has a capacitance determined according to a thickness d of the base 2 between the first body electrode 53 and the first base electrode 7 and an area of overlap between the first body electrode 53 and a projection of the first base electrode 7 on the first body electrode 53. The second base electrode 8 is disposed to cooperate with the second body electrode 63 and the base 2 to form a second capacitor load. The second capacitor load has a capacitance determined according to the thickness d of the base 2 between the second body electrode 63 and the second base electrode 8 and an area of overlap between the second body electrode 63 and a projection of the second base electrode 8 on the first body electrode 63.

Figure 9:
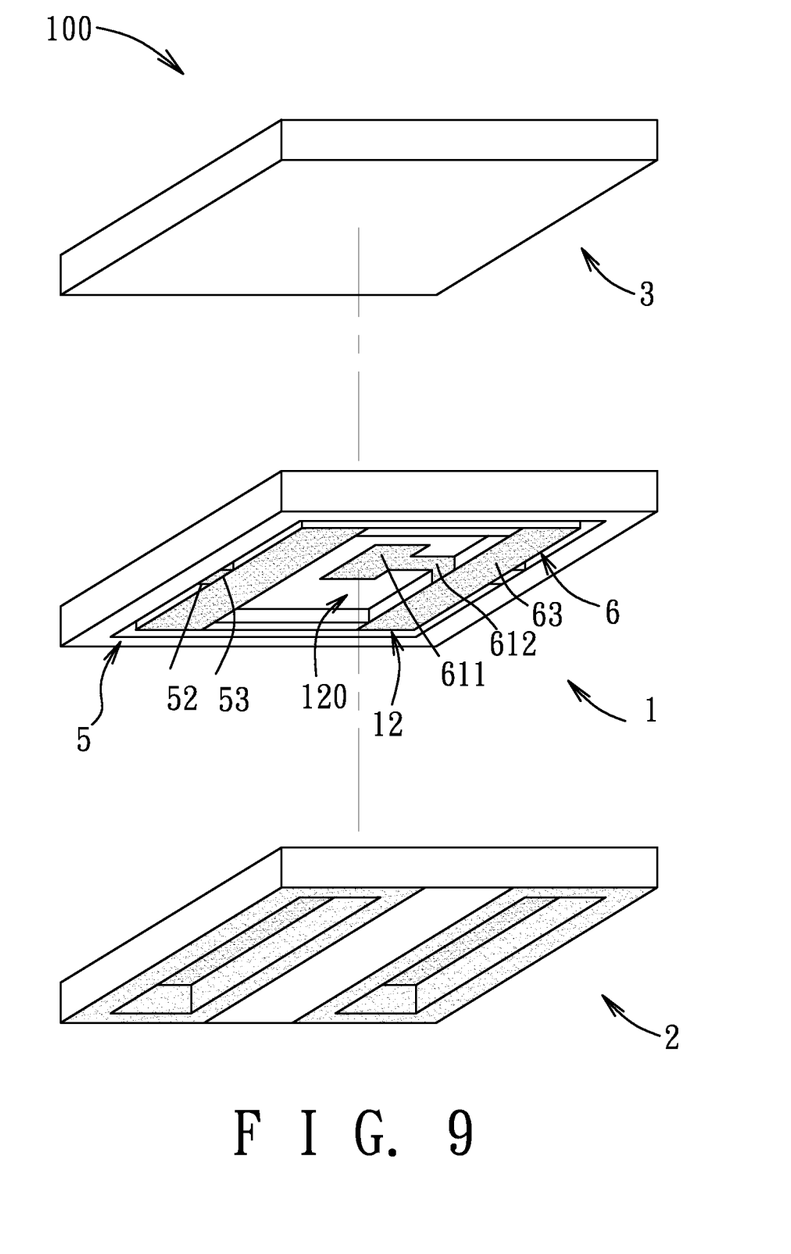
FIG. 9 is an exploded bottom perspective view of the preferred embodiment of the piezoelectric resonator.

Referring to FIG. 4, FIG. 8, and FIG. 9, the resonating body 12 has a cap-side surface opposite to the base-side surface. A cap-side groove 110 is formed in the cap-side surface, and a base-side groove 120 is formed in the base-side surface and is aligned with the cap-side groove 110. The resonant frequency is associated with the thickness D of the resonating body 12 between an innermost end of the cap-side groove 110 and an innermost end of the base-side groove 120.

The first conductor 5 further has a first connecting portion 52 disposed on the outer periphery of the resonating body 12 and extending from the first body electrode 53, a first neck portion 512 disposed on the cap-side surface and extending from the first connecting portion 52, and a first head portion 511 disposed in the cap-side groove 110 and extending from the first neck portion 512.

The second conductor 6 further has a second head portion 611 disposed in the base-side groove 120, and a second neck portion 612 extending from the second head portion 611 to connect with the second body electrode 63.

To sum up, the piezoelectric resonator 100 with built-in capacitor loads according to the present invention has the following advantages:

1. The piezoelectric resonator 100 does not need conductive silver paste, and no solvent gas is released, to thereby avoid the aging (frequency shift) issue.
2. The resonator substrate 1, the base 2, and the cap 3 are made of the same material (such as quartz), so that physical properties (such as expansion coefficient) are the same thereamong, thereby alleviating instability of the resonant frequency.
3. Seam welding or low temperature glass bonding is not used, such that stress is not applied on the base and the resonator substrate 1 to alleviate deterioration.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A piezoelectric resonator comprising:
    a resonator substrate having a frame with an inner side, a resonating body that is disposed in said frame, that has an outer periphery spaced apart from said inner side of said frame, and that has a base-side surface, and a connecting part that interconnects said frame and said resonating body, wherein said resonating body has a thickness that is associated with a resonant frequency;
    a first conductor having a first body electrode that is disposed on said base-side surface;
    a base on which said resonator substrate is disposed, said base having a first base surface in contact with said first conductor, and a second base surface opposite to said first base surface, said second base surface having a first groove aligned with said first body electrode and defined by a first groove-defining wall;
    a first base electrode disposed on said first groove-defining wall and cooperating with said first body electrode and said base to form a first capacitor load, wherein the first capacitor load has a capacitance determined according to a thickness of said base between said first body electrode and said first base electrode and an area of overlap between said first body electrode and a projection of said first base electrode on said first body electrode; and
    a cap disposed on said resonator substrate in a manner that said resonator substrate is sandwiched between said cap and said base.

2. The piezoelectric resonator as claimed in claim 1, further comprising:
    a second conductor having a second body electrode that is disposed on said base-side surface and that is spaced apart from said first body electrode;
    said second base surface further having a second groove aligned with said second body electrode and defined by a second groove-defining wall;
    a second base electrode disposed on said second groove-defining wall and cooperating with said second body electrode and said base to form a second capacitor load, wherein the second capacitor load has a capacitance determined according to a thickness of said base between said second body electrode and said second base electrode and an area of overlap between said second body electrode and a projection of said second base electrode on said second body electrode.

3. The piezoelectric resonator as claimed in claim 2, wherein said resonating body further has a cap-side surface opposite to said base-side surface, a cap-side groove formed in said cap-side surface, and a base-side groove formed in said base-side surface and aligned with said cap-side groove, the resonant frequency being associated with a thickness of said resonating body between an innermost end of said cap-side groove and an innermost end of said base-side groove.

4. The piezoelectric resonator as claimed in claim 3, wherein said first conductor further has a first connecting portion disposed on said outer periphery of said resonating body and extending from said first body electrode, a first neck portion disposed on said cap-side surface and extending from said first connecting portion, and a first head portion disposed in said cap-side groove and extending from said first neck portion.

5. The piezoelectric resonator as claimed in claim 4, wherein said second conductor further has a second head portion disposed in said base-side groove, and a second neck portion extending from said second head portion to connect with said second body electrode.

6. The piezoelectric resonator as claimed in claim 1, wherein said resonating body further has a cap-side surface opposite to said base-side surface, a cap-side groove formed in said cap-side surface, and a base-side groove formed in said base-side surface and aligned with said cap-side groove, the resonant frequency being associated with a thickness of said resonating body between an innermost end of said cap-side groove and an innermost end of said base-side groove.

7. The piezoelectric resonator as claimed in claim 6, wherein said first conductor further has a first connecting portion disposed on said outer periphery of said resonating body and extending from said first body electrode, a first neck portion disposed on said cap-side surface and extending from said first connecting portion, and a first head portion disposed in said cap-side groove and extending from said first neck portion.

8. The piezoelectric resonator as claimed in claim 1, wherein said cap, said resonator substrate, and said base are made of quartz.

* * * * *